(12) United States Patent
Madathil (10) Patent No.: US 10,170,605 B2
(45) Date of Patent: Jan. 1, 2019

(54) MOS-BIPOLAR DEVICE

(71) Applicant: ECO SEMICONDUCTORS LIMITED, Leicester (GB)

(72) Inventor: Sankara Madathil, Leicester (GB)

(73) Assignee: ECO SEMICONDUCTORS LIMITED, Leicester (GB)

( * ) Notice: Subject to any disclaimer, the term of this patent is extended or adjusted under 35 U.S.C. 154(b) by 0 days.

(21) Appl. No.: 14/906,654

(22) PCT Filed: Jul. 2, 2014

(86) PCT No.: PCT/GB2014/052013
§ 371 (c)(1),
(2) Date: Jan. 21, 2016

(87) PCT Pub. No.: WO2015/011440
PCT Pub. Date: Jan. 29, 2015

(65) Prior Publication Data
US 2016/0155831 A1    Jun. 2, 2016

(30) Foreign Application Priority Data

Jul. 23, 2013 (GB) .................................. 1313126.3
Aug. 13, 2013 (GB) .................................. 1314474.6

(51) Int. Cl.
*H01L 29/06* (2006.01)
*H01L 29/739* (2006.01)
(Continued)

(52) U.S. Cl.
CPC ...... *H01L 29/7395* (2013.01); *H01L 29/0615* (2013.01); *H01L 29/0696* (2013.01);
(Continued)

(58) Field of Classification Search
CPC ............. H01L 29/0696; H01L 29/1095; H01L 29/8613
See application file for complete search history.

(56) References Cited

U.S. PATENT DOCUMENTS

2004/0094798 A1* 5/2004 Hara .................. H01L 29/0634
257/330
2007/0252195 A1 11/2007 Yoshikawa et al.
(Continued)

FOREIGN PATENT DOCUMENTS

CN           1373905 A     10/2002
JP         2001044415      2/2001
(Continued)

OTHER PUBLICATIONS

Vershinin Ket Al: "Experimental Demonstration of a 1.2kV Trench Clustered Insulated Gate Bipolar Transistor in Non Punch Through Technology", Proceedings of the 18th International Symposium on Power Semiconductor Devices & ICS; Jun. 4-8, 2006; Naples, Italy. (IEEE Cat. No. 06CH37817C), IEEE Operations Center, Piscataway, NJ, USA, Jun. 4, 2006.*
(Continued)

*Primary Examiner* — Thomas L Dickey
(74) *Attorney, Agent, or Firm* — Hodgson Russ LLP (57) ABSTRACT

A clustered Insulated Gate Bipolar Transistor (CIGBT) comprising a drift region (24), a P region (20) formed within the n-type drift region, an N well region (22) formed within the P well region (20), a P base region (32) formed within the N well region (22) and a cathode region (36). One or more trenches (40) are formed in the device and configured to longitudinally intersect the drift region (24) and, optionally, the P well region (20) as well as laterally intersecting the base region (32), the N well region (22) and the P well region (20). An insulating film is formed on the inner surface of the
(Continued)

TCIGBT structure with dummy cells trenches (40) and gate oxide is formed on the insulating film so as to substantially fill the trenches and form a gate.

14 Claims, 13 Drawing Sheets

(51) Int. Cl.
  *H01L 29/66* (2006.01)
  *H01L 29/10* (2006.01)
  *H01L 29/40* (2006.01)

(52) U.S. Cl.
  CPC .... *H01L 29/1095* (2013.01); *H01L 29/66348* (2013.01); *H01L 29/7397* (2013.01); *H01L 29/407* (2013.01)

(56) References Cited

U.S. PATENT DOCUMENTS

2009/0008674 A1* 1/2009 Udrea ................ H01L 29/0696
  257/138
2012/0043581 A1* 2/2012 Koyama ............. H01L 29/0696
  257/140
2013/0075810 A1 3/2013 Hsieh

FOREIGN PATENT DOCUMENTS

| JP | 2004200540 | 7/2004 |
| JP | 2012227335 | 11/2012 |
| WO | 0118876 | 3/2001 |

OTHER PUBLICATIONS

Written Opinion in WO2015011440, downloaded Jan. 6, 2017.*
'Electronic, Optical and Magnetic Properties of Materials' Lecture 18 ('The P—N Junction') Massachusetts Institute of Technology, 2012.*
Luther-King et al., Performance of a trench PMOS gated, planar, 1.2 kV clustered insulated gate bipolar transistor in NPT technology, 2009, pp. 164-167, IEEE.

* cited by examiner

MOS-BIPOLAR DEVICE

BACKGROUND OF THE INVENTION

This invention relates to a MOS-bipolar device and, more particularly, to a Clustered Insulated Gate Bipolar Transistor (CIGBT) and a process for fabrication thereof.

Traditionally, power Metal Oxide Field Effect Transistors (MOSFETs) have been used in low to medium power applications. However, it has been found that Insulated Gate Bipolar Transistors (IGBTs) enable better switching performance in such applications due to their lower on-state power loss and higher current densities. The power ratings of IGBTs are slowly increasing and they are envisaged to replace thyristors in medium power applications such as High Voltage Direct Current (HDVC) inverter systems and traction drive controls.

MOS Gated Thyristor (MGT) devices have been identified as a promising alternative to transistor based devices as they exhibit a lower forward voltage drop and improved current densities. The CIGBT described in International Patent Application No. WO01/18876 is a MOS gated thyristor device that exhibits a unique self-clamping feature that protects cathode cells from high anode voltages under all operating conditions. The self-clamping feature also enables current saturation at high gate biases and provides low switching losses, and its low on-state voltage and high voltage blocking capabilities make the CIGBT highly suitable as an alternative to the IGBT.

It is an object of the present invention to provide a cathode cell structure, and method of fabricating the same, using CIGBT technology.

SUMMARY OF THE INVENTION

In accordance with the present invention, there is provided a semiconductor device comprising at least one cell comprising a base region of a first conductivity type having disposed therein at least one cathode region of a first and second conductivity type, connected together through a conductive contact; a first well region of a second conductivity type; a second well region of a first conductivity type; a drift region of a second conductivity type; a anode region of a first conductivity type; and an anode contact; in which each cell is disposed within the first well region and the first well region is disposed within the second well region; wherein the device comprises an elongate trench that longitudinally intersects the second well region and the drift region and laterally intersects the base region and the first well region, wherein an insulating film is provided to substantially cover the inner surface of the trench and wherein a gate is provided on the insulating film so as to substantially fill the trench; and in which the device is configured such that during operation of the device a depletion region at a junction between the base region and the first well region can extend to a junction between the first well region and the second well region, thereby substantially isolating the potential of the first well region from any increase in the potential of the anode contact.

In a first exemplary embodiment of the invention, the trench is configured to laterally intersect the first and second wells, in which case, the trench can extend through the full thickness of the second well region into the drift region, or not, as required. Thus, the trench may not extend into the second well at all, but if it does, it may terminate within the second well or it may extend through the full thickness of the second well into the drift region. This is dependent on, for example, required device characteristics and processing constraints.

Also in accordance with the present invention, there is provided a method of manufacturing a semiconductor device as defined above, comprising the steps of forming the second well region within a semiconductor layer of the second conductivity type, such that the remaining semiconductor layer forms the drift region, forming the first well region within the second well region, forming the base region within the first well region, and forming the cathode region; the method further comprising forming an elongate trench such that it longitudinally intersects the second well region and the drift region, and laterally intersects the base region and first well region.

In an exemplary embodiment of the invention, the method further comprises the steps of forming a plurality of semiconductor devices according to claim 1 on a semiconductor substrate, the devices being arranged in one or more substantially parallel rows, and forming a plurality of elongate trenches in substantially parallel rows which run substantially perpendicular to the row or rows of semiconductor devices, such that each trench longitudinally intersects the second well region and drift region, and laterally intersects the base region and first well region of at least one semiconductor device.

The or each trench may be configured to laterally intersect the first and second well regions of the respective semiconductor device, but preferably the or each trench does not extend through the full thickness of the second cell region.

The method may further comprise the step of forming an insulating layer on the inner surface of the or each trench, and forming a gate configured to substantially fill the respective trench.

In one exemplary embodiment of the invention, each device of the or each row of devices may be configured to be operative.

However, in an alternative exemplary embodiment of the invention, only a proportion of devices may configured to be operative, with remaining inoperative devices being designated as dummy cells. For example, each device of alternate rows of devices may be configured to be operative, with the devices of the remaining rows being designated as dummy cells.

The present invention extends to a semiconductor structure comprising a plurality of semiconductor devices as defined above, arranged in substantially parallel rows of devices, and including a plurality of trenches arranged in substantially parallel rows, substantially perpendicular to the rows of semiconductor devices, each trench being configured to longitudinally intersect the second well and drift regions, and laterally intersect the base, first well and second well regions, of a device on each row devices; and wherein an insulating film is provided to substantially cover the inner surface of at least one of the trenches, with a gate being formed on the insulating film so as to substantially fill the or each said trench.

BRIEF DESCRIPTION OF THE DRAWINGS

An exemplary embodiment of this invention will now be described by way of example only and with reference to the accompanying drawings, in which.

DETAILED DESCRIPTION OF EMBODIMENTS OF THE INVENTION

Figure 1A:
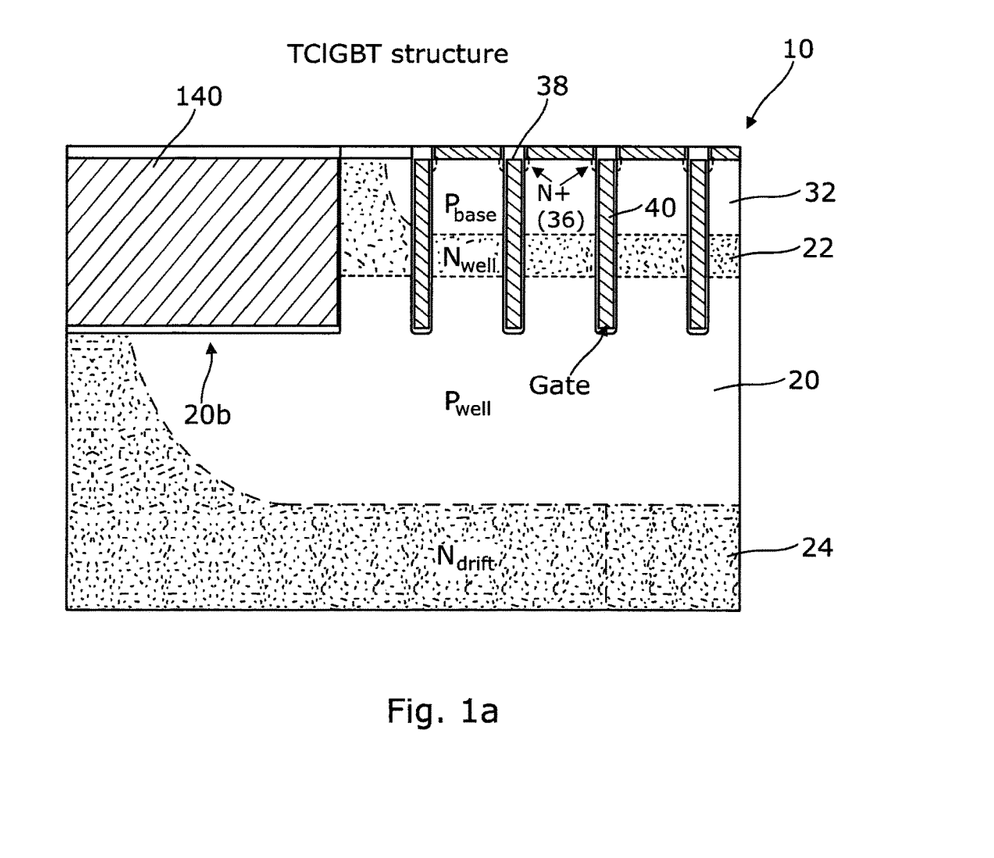
FIG. 1a is a schematic partial front cross-sectional view of a cathode structure in accordance with an exemplary embodiment of the present invention.

Referring to FIG. 1a of the drawings, in which the contact layers, anode region and anode contact, as well as the cathode regions, have been omitted in order to illustrate the internal structure of the cells fabricated in accordance with an exemplary embodiment of the present invention. Thus, FIG. 1a shows a portion 10 of a body of semiconductor material, typically monocrystalline silicon. The device is an NPT (non-punch through) device fabricated from N type silicon through which diffusions are made to provide a pattern of cathode cells at the upper surface. PT (punch through) and/or Field Stop (FS) technologies are also within the scope of the invention.

Figure 1B:
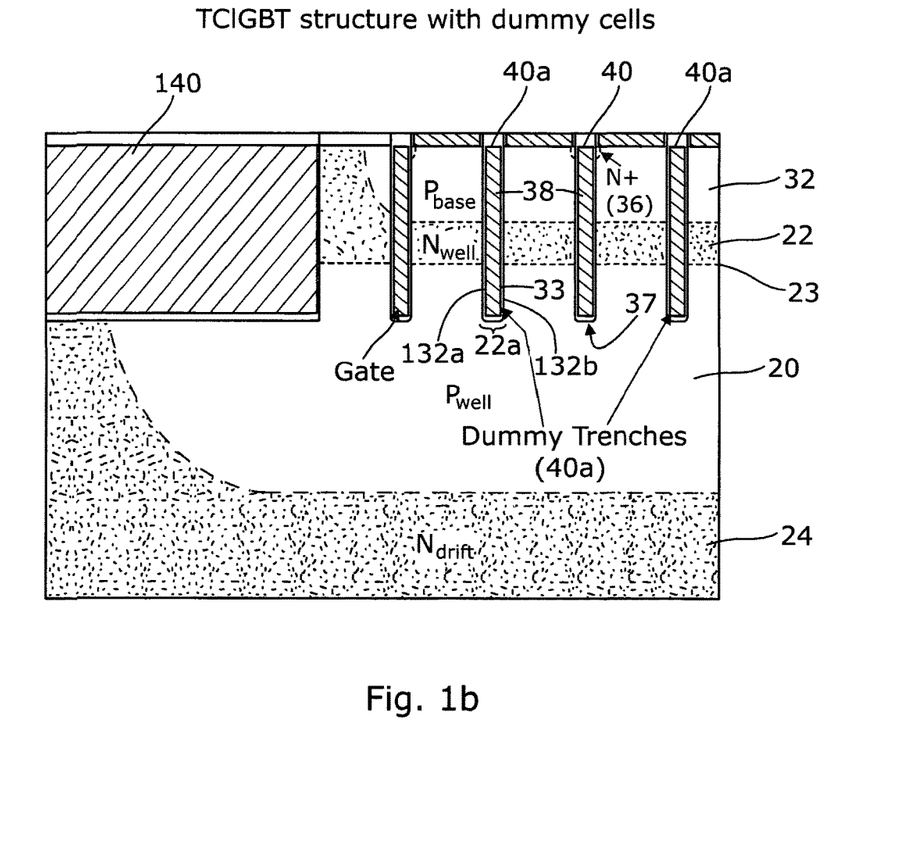
FIG. 1b is a schematic partial side cross-sectional view of a cathode structure, including dummy trenches, in accordance with an exemplary embodiment of the present invention.
Figure 1C:
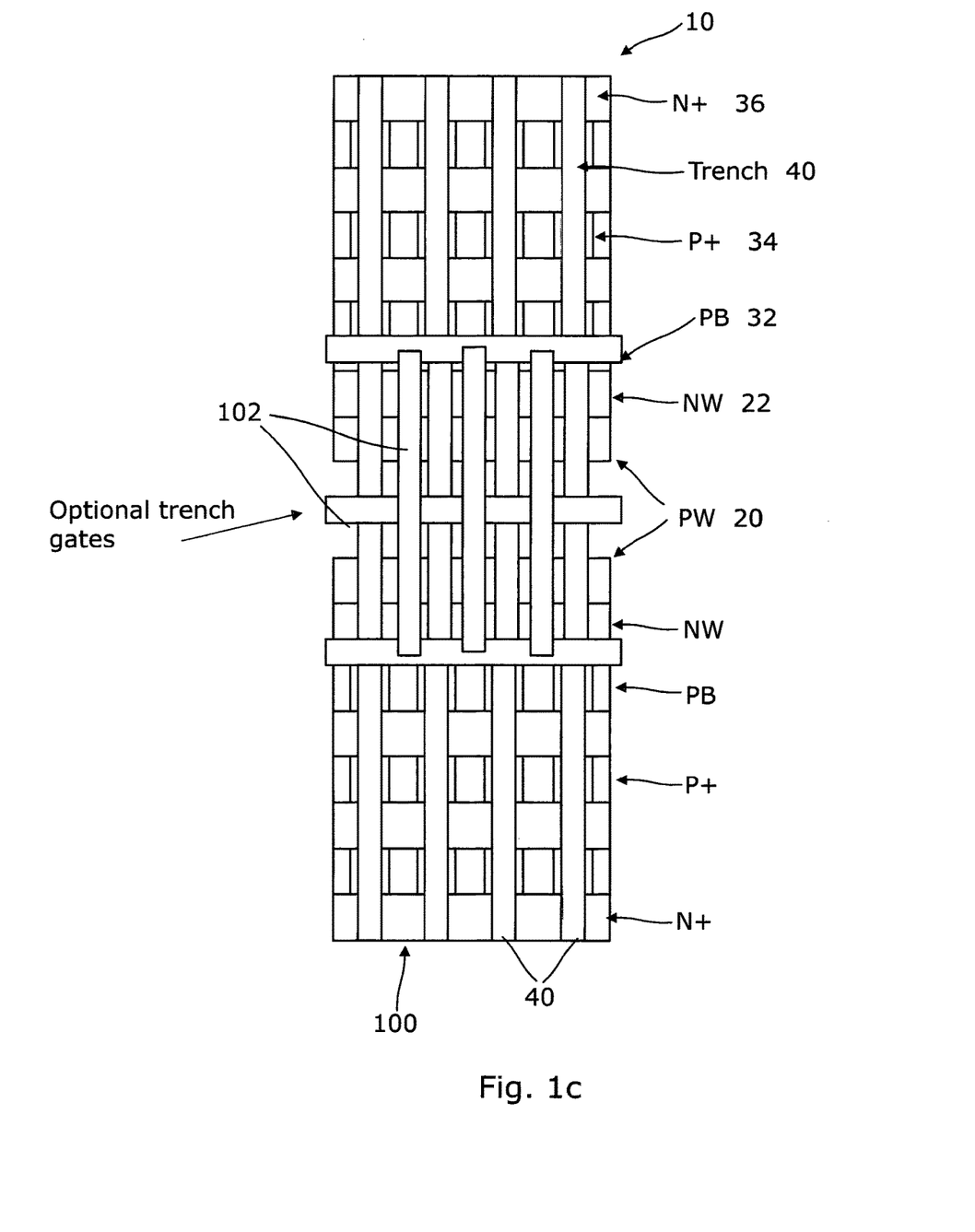
FIG. 1c is a schematic plan view of a structure carrying a plurality of cathode cells.

The device structure comprises an N drift region 24 into which a P well 20 is diffused. The device further includes an N well 22 diffused into the P well 20, so as to lie within the P well both vertically and laterally, thereby leaving a P region 20a which will lie in the main current path, in use. The region 20b provides a channel overlaid by a MOSFET gate 140. In FIGS. 1a, b and c, gate oxide is shown as black.

Within the N well 22, a cluster of cathode cells are provided, separated by trenches and each cell is identical in structure so that only one of them will be described in detail. Thus, each cell comprises a shallow P base 32 diffused into N well 22.

Figure 4:
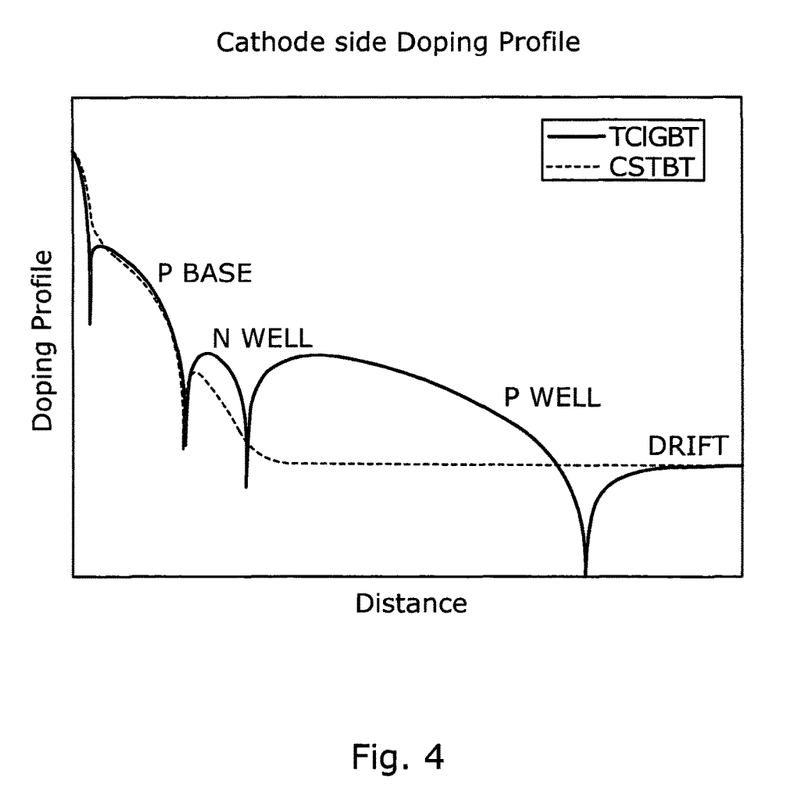
FIG. 4 illustrates the comparative doping profile of a device according to an exemplary embodiment of the present invention.

A comparative doping profile for a device according to an exemplary embodiment of the invention is illustrated in FIG. 4 of the drawings.

All the diffusions are made through upper surface using, for example, a plurality of conventional lithography stages. The particular process used to achieve these diffusions is not critical to the invention, any known process for effecting diffusion regions may be used, and this process will, therefore, not be described further in any detail. However, it will be appreciated by a person skilled in the art that it may be possible to form the structure with growth processes involving those regions selectively or otherwise, such as epitaxy, and this is applicable, particularly, but not exclusively, to wide bandgap devices such as Silicon Carbide devices.

Referring now to FIG. 1b of the drawings, and as stated previously, the N well contains a cluster of cathode cells, each cell being of the same symmetric construction. The cells are formed in a single P base region 32 which is intersected by the gate structure of each cell. The gate structure comprises a trench 40, etched from surface 26, and extending from that surface into the P well region 20. In alternative embodiments, the trench 40 may extend only into the N well region, or extend all the way through the thickness of the P well into the drain region 20. A polysilicon gate 38 is located in the trench and isolated from the adjacent silicon material by gate oxide 33.

In an exemplary embodiment of the present invention, after the trench gates have been formed, a P+ region 34 is selectively diffused into the P base 32, and then the N+ cathode regions 36 are diffused into the P+ region 34, the cathode regions forming a non-rectifying junction with the P+ base region 34. In an alternative exemplary embodiment, the P+ region 34 and the cathode regions 36 may be formed before the trenches 40 are formed, such that the trenches are formed so as to extend through the P+ and cathode regions 34, 36, as well as the P base region 32 and the N well 22.

Figure 3A:
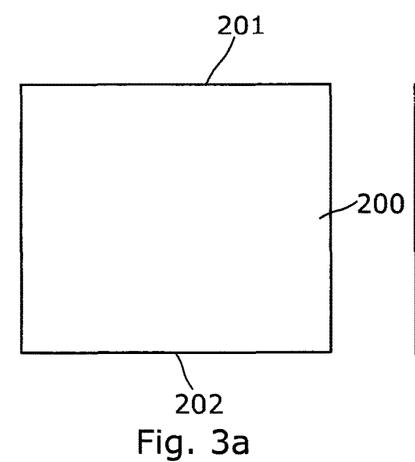
FIGS. 3a to 3e are schematic cross sectional views illustrating the various stages in the fabrication process of a device according to an exemplary embodiment of the present invention.
Figure 3B:
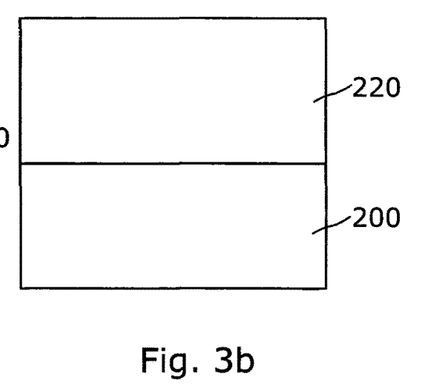

Thus, in either case, adjacent the surface, N+ regions 36 are formed within the base material 32. The regions 132a and 132b provide respective channels of MOSFETs, each having a source 36 and a drain at the portions 122 of the P well 20 by the gate. The gate controls the conduction from the cathode/source contact metallisation (140, FIG. 3a) to the P well. In FIG. 3b, the cathode contacts are provided by metallisation extending to each source region 36 and it will be noted that at the surface 26 the contacts bridge the PN junctions between the N+ regions 36 and the P base 34.

A P+ anode region 14 is formed on the lower surface of the drift region 24, to which the anode contact 16 is made.

In some cases, it may be required to provide so-called "dummy cells" within the structure, in order to increase the spacing between the N well of a cathode cell and that of adjacent cells. This can be achieved simply by including a cell such as that shown in FIG. 1b, but which is left to float or connected to ground and, thus, non-operational. In a dummy cell, there is no n+ region. Thus a dummy cell can be connected to the cathode or not. These dummy cells can be dispersed independently within the cluster. Furthermore, some of the trenches 40a in an operational cell may be designated as "dummy trenches". This is achieved in the arrangement of FIG. 1b, simply by omitting the cathode contacts 37 for trenches designated as dummy trenches, leaving them dormant or non-operational. The number of dummy cells within a structure, and the number of dummy trenches within an operational cell, is dependent upon design, fabrication process used and device characteristics required. However, it has been shown that the use of dummy cells in the cathode cell structure can improve the trade-off between the on-state and turn-off losses. As stated above, dummy cells can be left to float or connected to ground. Dummy cells and dummy trenches can be connected together to ground or left to float. Dummy trenches can also be left to float.

Figure 2A:
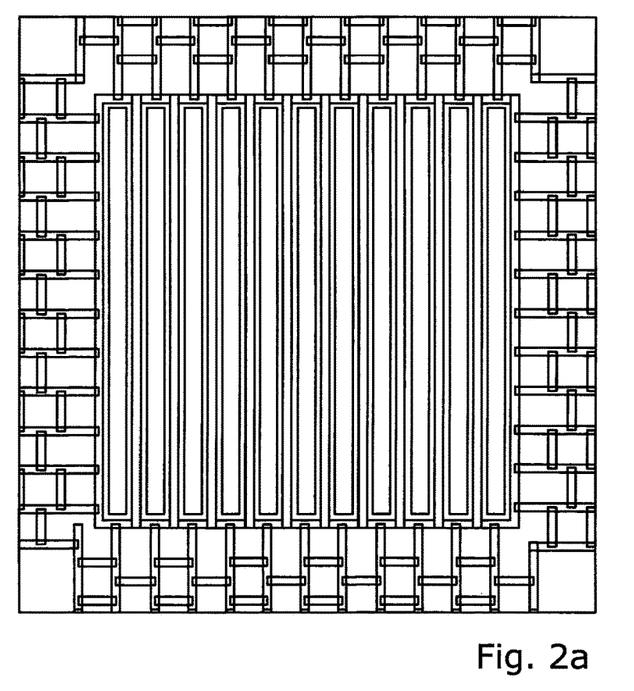
FIGS. 2a to 2e are plan schematic views of cathode geometries in accordance with respective exemplary embodiments of the present invention.
Figure 2B:
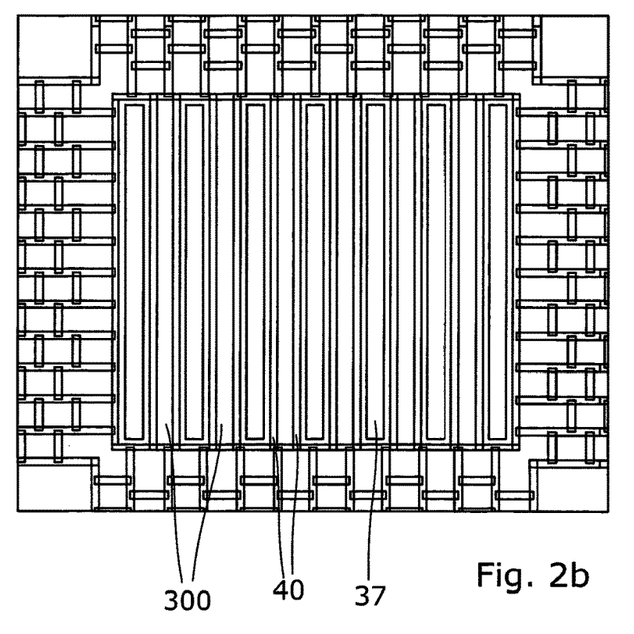
Figure 2C:
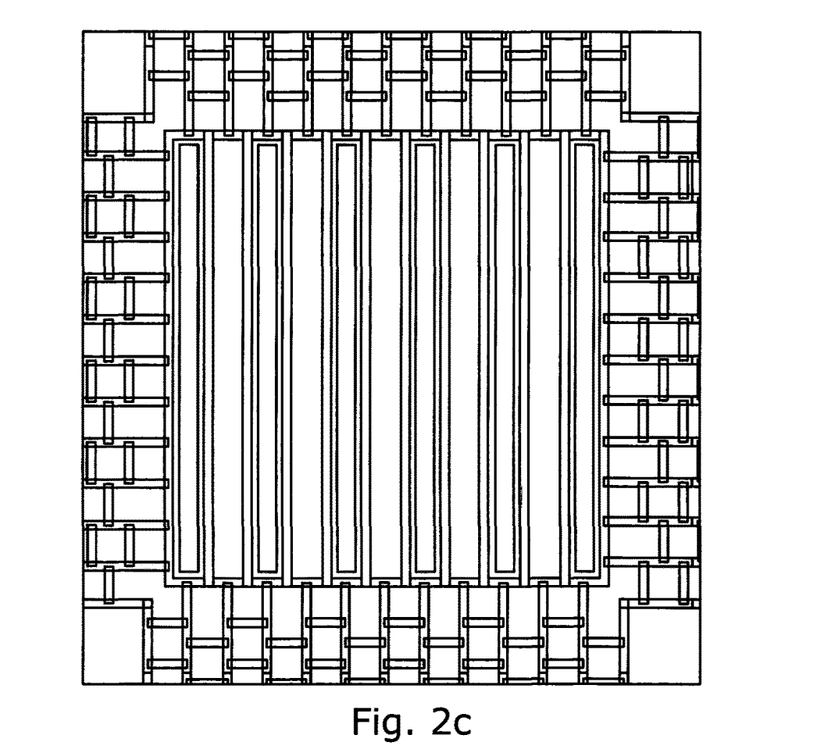
Figure 2D:
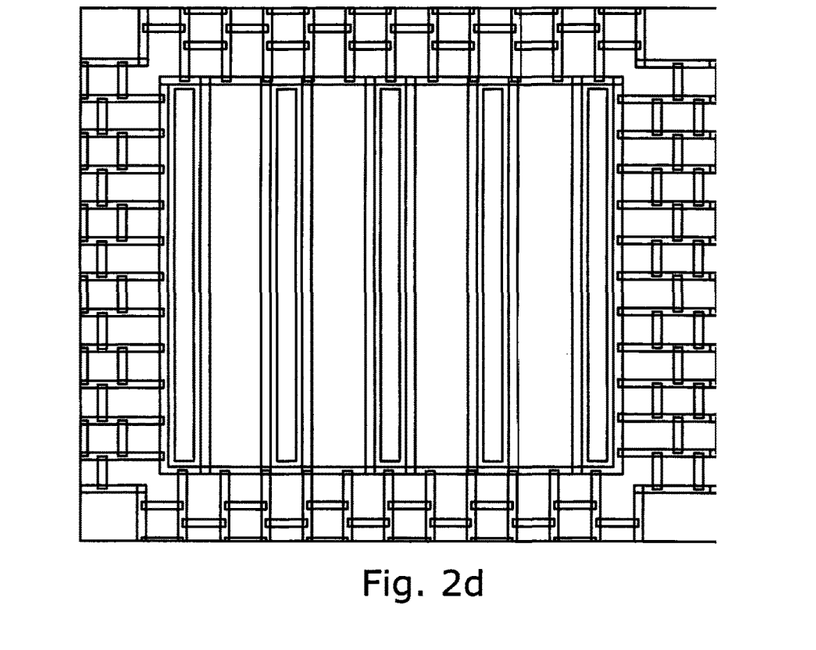

There are many different possible trench configurations envisaged for use with the above-described device. Referring now to FIGS. 2a, b, c, d and e of the drawings, four different possible striped cathode geometries are illustrated. FIG. 2a illustrates a striped design in which there is 100% contact and no dummy cells are provided along the axis, such that all cathode cells are "live" components. This is shown more clearly in FIG. 2g of the drawings, in which the connecting trenches (to other cathode clusters) are omitted. FIG. 2b illustrates the case where there is one dummy cell per active cell, wherein the black areas 300 between trenches 40 are the dummy areas. In the arrangement shown, the dummies are placed along the Y-axis. FIG. 2c illustrates the case where there are two dummies per unit trench, and FIG. 2d illustrates the case where there are three dummies per unit trench.

Figure 2E:
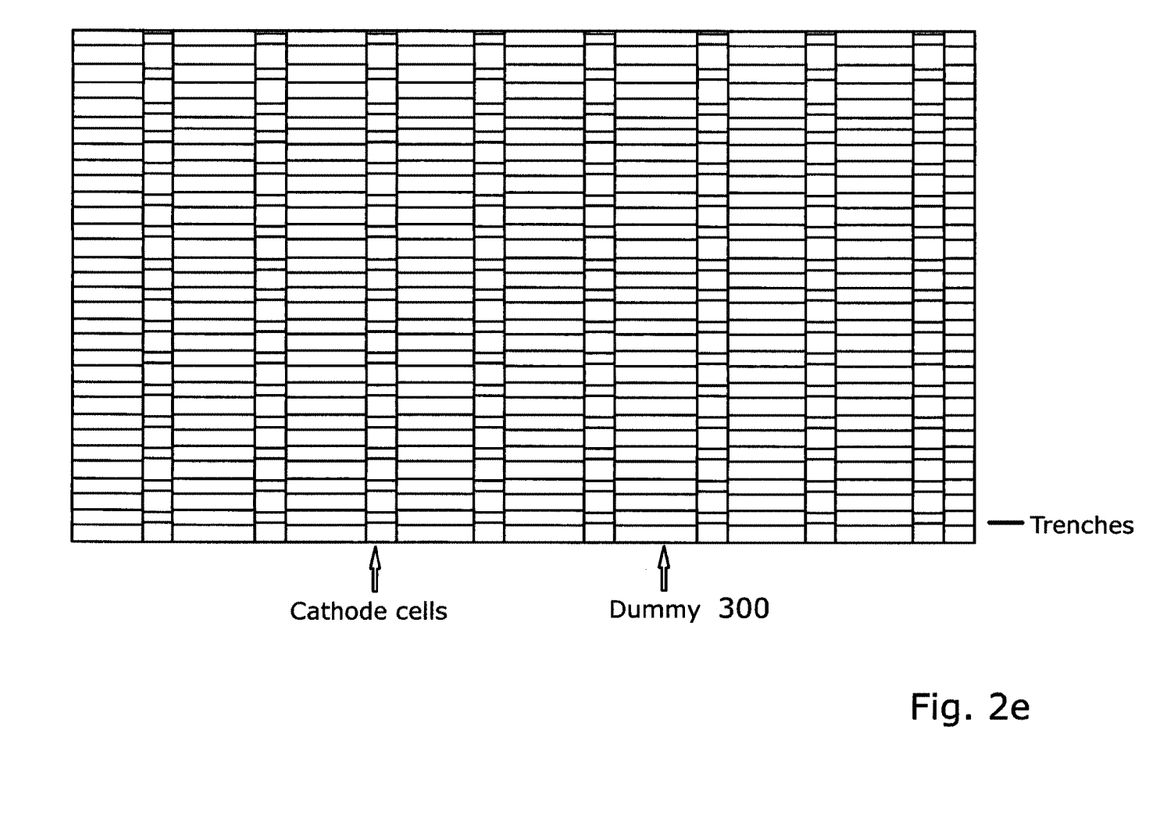

FIG. 2e illustrates the case where there are dummies 300 located perpendicular to the trenches 40.

Figure 2F:
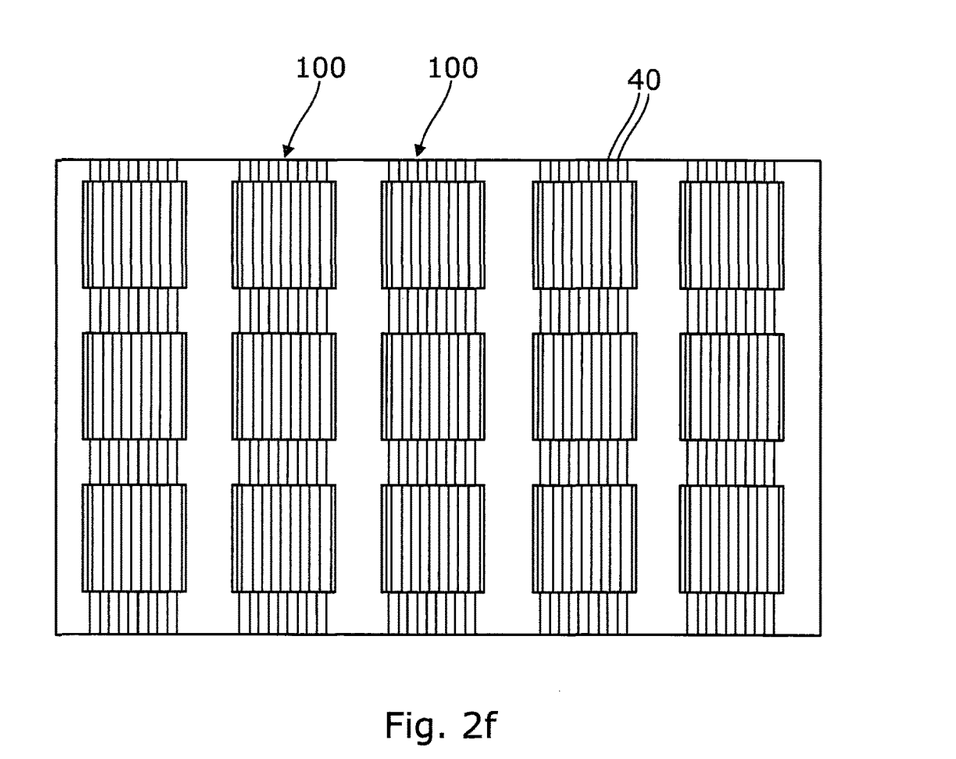
FIG. 2f is a plan view of a structure carrying a plurality of cathode cells illustrating how they can be built together on a single substrate.
Figure 2G:
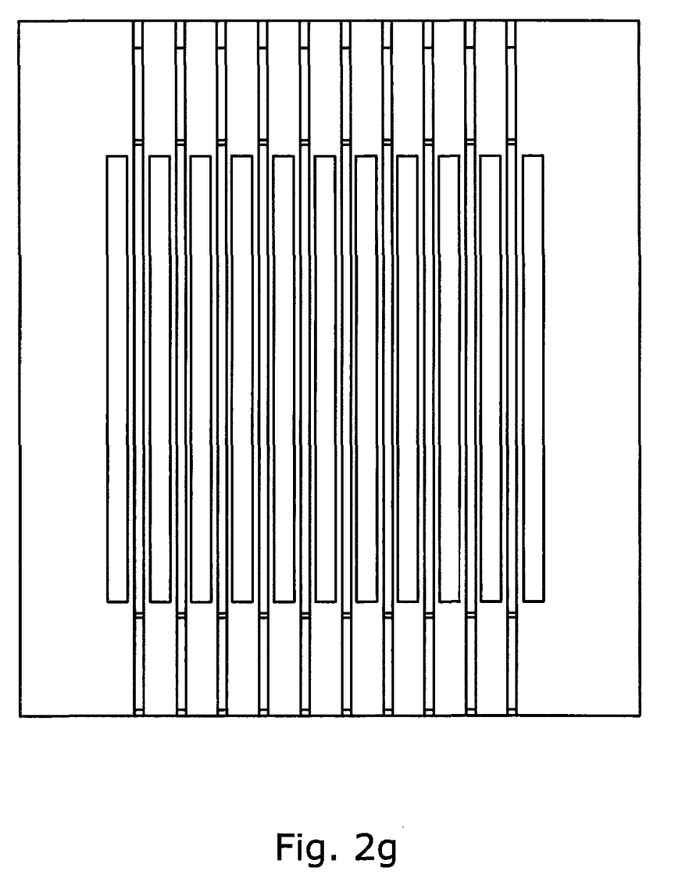
FIG. 2g is a plan view of the geometry of FIG. 2a, with the connecting trenches omitted for clarity.

The cathode clusters can be built together. Referring, for example, to FIGS. 1c and 2f of the drawings, a striped configuration is illustrated in which there are a plurality of parallel "stripes" or trenches 40, between blocks 100 of cathode cells, wherein each cell is provided with a set of gate contacts (not shown) and connected thereby, via trenches 102, to the power supply. It will be appreciated that these connecting trenches do not need to be configured in the manner shown, i.e. longitudinally and/or horizontally across the device—a large number of alternative configurations is envisaged, for example, a zig-zag pattern, and the present invention is in no way intended to be limited in this regard. A number of trench gates can be dispersed between the clusters, depending upon the loading conditions of specific equipment used. In FIG. 2b, however, there are wider spaces between "live" blocks, and in FIGS. 2c and 2d, these spaces are wider again. There need not necessarily be "dummy" trenches in these spaces. However, in terms of fabrication constraints, including ease of etching and lithography, this may be desirable, so as to avoid having to alter lithography or etching masks for each design. In all configurations it can be seen that the same trench longitudinally intersects the drift and P well regions of each device, as well as laterally intersecting the base, N well and P well regions, as shown in FIG. 1b.

Figure 5:
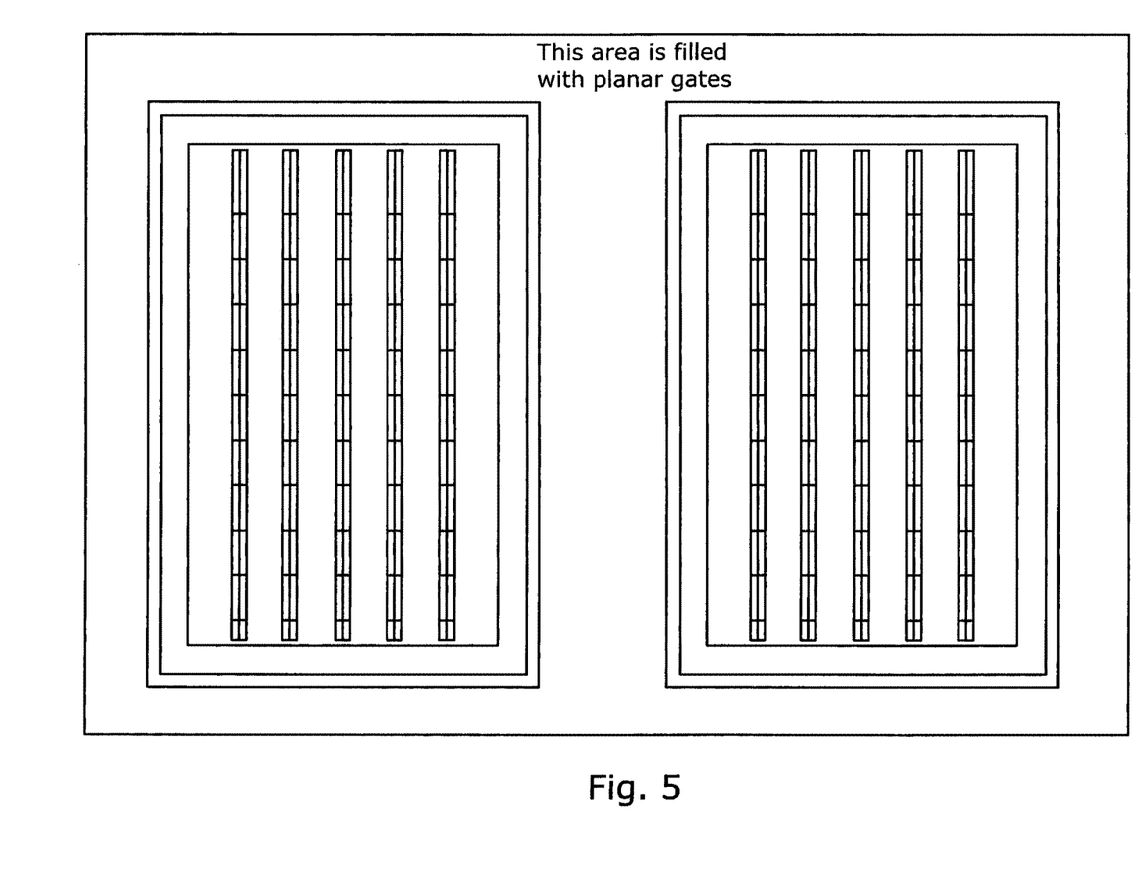
FIG. 5 illustrates a structure according to an exemplary embodiment of the present invention, illustrating the use of planar gates to connect the clusters.

It will be appreciated that planar gates can be used for connecting the cluster cells, as shown in FIG. 5 of the drawings.

Referring additionally to FIG. 1b, When a positive bias above the threshold voltage is applied to the gate, the cathode MOSFETs are turned on and the electrons are supplied into the N-drift region 24. When the anode voltage is above the bipolar on-set voltage, holes are injected from the anode. However, there is no path for holes to flow directly into the cathode regions. As a result, the potential of the P well region 20 increases. The concentration of the N region 22 plays an important role in the overall performance of the device and is above the critical limit required to create a barrier for holes, as is the case with a charge stored IGBT (CS-IGBT). When the control gates are ON, the N well 22 is tied to the cathode potential through the accumulation region formed in the N well region and inverted channels in the P base region 32. With increase in the potential differences of the P well and N well junction above its built-in potential, results in the firing ON of the thyristor.

Once the thyristor is ON, the N well/P well (22/20) potential increases with further increase in the anode voltage. This increase in the potential leads to the enhancement of the P base 32/N well 22 depletion region. As the concentration of the N well 22 is lower than that of the P base 32, the depletion region predominantly moves into the N well region. At a certain voltage (determined by the doping concentration, the depth of the N well, the depth of the P base and the MOS channel saturation characteristic), the depletion touches the P well/N well junction 23 and at that point the device becomes clamped. The self clamping feature ensures that any further increase in the anode potential is dropped only across the P well/N drift (20/24) region.

The device turn-off performance is similar to that of the IGBT. When the control gate is turned off, the potential across the P base/N well (32/22) increases until self-clamping occurs. Once it is clamped, the wide nature of the P well 20 enables the holes to be collected to the P base region 32, 34 effectively.

It will be appreciated that other designs are envisaged whereby a single elongate trench is used to longitudinally intersect the P well and drift regions and laterally intersect the base, N well and P well regions of a clustered insulated gate bipolar transistor, and the present invention is not intended to be limited in this regard.

Figure 3C:
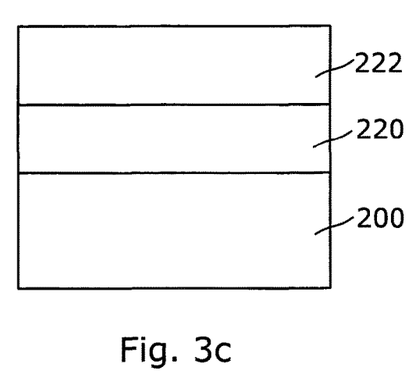
Figure 3D:
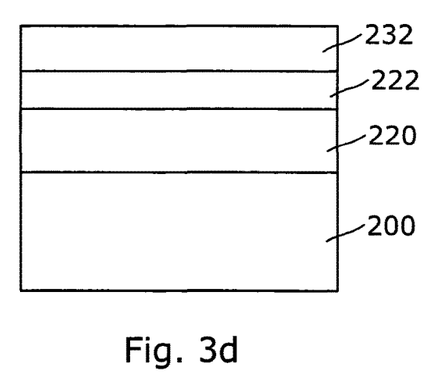

An exemplary fabrication process will now be described with reference to FIGS. 3a to 3h of the drawings. Thus, referring to FIG. 3a, the process starts with a prepared n-type semiconductor 200 having an upper surface 201 and an opposing lower surface 202. Next, the P well layer 220 is formed through the upper surface 201 of the n-type semiconductor 200 by, for example, photolithography and ion implantation, as shown in FIG. 3b. Referring to FIG. 3c of the drawings, the N well layer 222 is formed within the P well layer 220, again through the upper surface 201 of the structure by, for example, photolithography and ion implantation. In FIG. 3d, the P base layer 232 is seen to have been formed within the N well layer 222, again through the upper surface and again by means of, for example, photolithography and ion implantation.

Figure 3E:
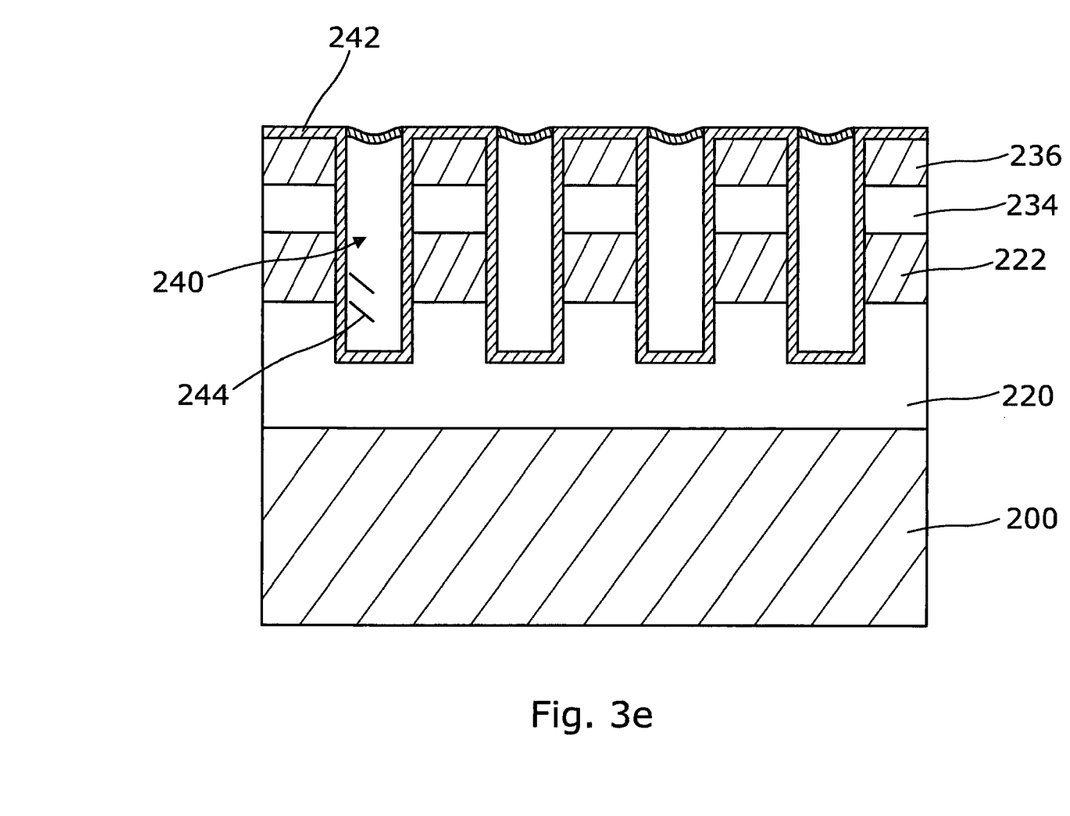
Figure 3F:
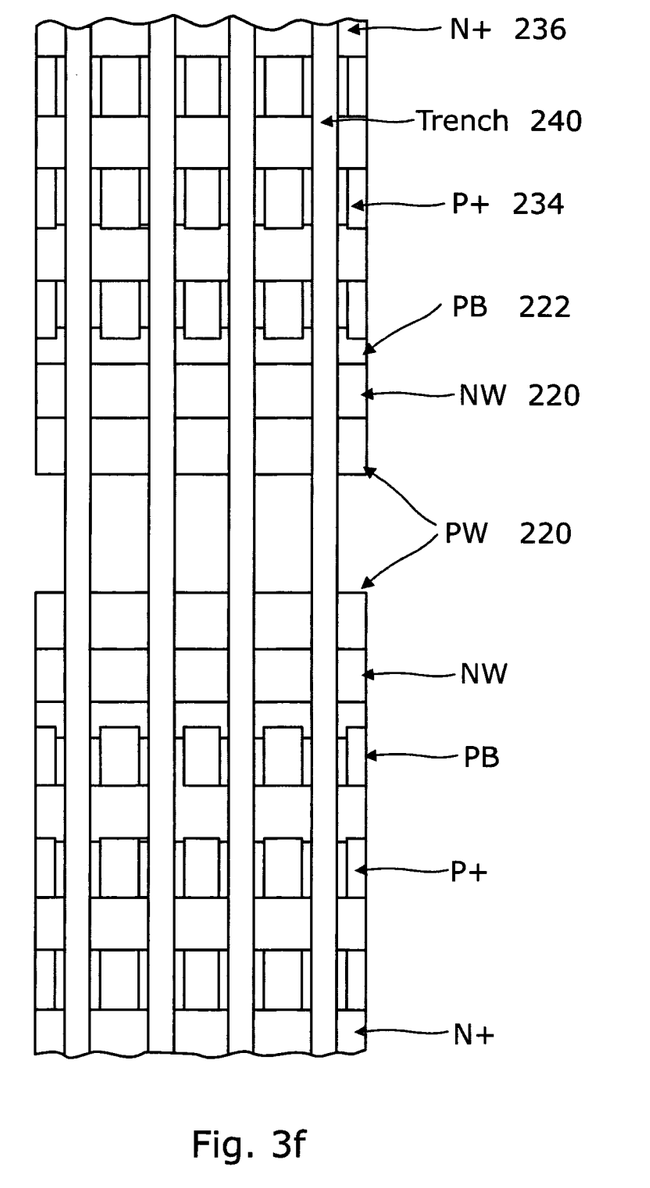
FIG. 3f is a schematic plan view of a single cell of a device according to an exemplary embodiment of the invention to illustrate the configuration of a trench.

Referring now to FIG. 3e of the drawings, the trenches 240 which will serve as gates are selectively formed by, for example, dry etching. These trenches 240 are formed so as to laterally intersect the P base layer 232, the N well layer 222 and the P well layer 220, although the trenches may terminate within the N well region 222 or extend through the P well region 220 into the drift region. The trenches also longitudinally intersect the substrate 200, the P well layer 220 and the N well layer 222, as shown in the schematic plan view of FIG. 3f. In one exemplary embodiment, the P+ layer 234 and cathode layer 236 are selectively formed after the trench gates have been formed, although these layers may be formed prior to the formation of the trenches.

Referring back to FIG. 3e, the inner surfaces of the trenches 240 are covered with a gate oxide (insulating film 240, and the gate electrodes 244 are formed on the gate oxide film 242 so as to fill the trenches. The gate electrodes 244 may be formed of, for example, doped polysilicon by any suitable process known to a person skilled in the art such as, for example, chemical vapour deposition (CVD). An insulating film (not shown) is selectively formed over the trench openings and then the cathode electrode (not shown) is formed over the upper surface of the structure.

Finally, the N+ buffer layer (not shown), if required, and the P anode layer are formed on the lower side 202 of the n-type substrate 200. It will be appreciated, however, the the buffer layer is not required in NPT technology.

It will be appreciated that the invention is not intended to be in any way limited to the manner in which each region and layer of the device are formed. Any one of a number of suitable deposition, etching and implantation methods will be apparent to a person skilled in the art and these are all intended to fall within the scope of the invention.

The invention claimed is:

1. A semiconductor device comprising a cluster of cells, wherein at least a portion of the cells comprise a base region of a first conductivity type having disposed therein at least one cathode region of a first and second conductivity type, the cathode regions being connected together through conductive contacts such that the cells are operative, and wherein at least a portion of the remaining cells comprise a base region of a first conductivity type and no cathode regions so that the remaining cathode regions are configured to be inoperative and designated as dummy cells; a first well region of a second conductivity type; a second well region of a first conductivity type; a drift region of a second conductivity type; an anode region of a first conductivity type; and an anode contact; in which each cell is disposed within the first well region and the first well region is disposed within the second well region; wherein the device comprises an elongate trench that longitudinally intersects the second well region and the drift region and laterally intersects the base region and the first and second well regions, the trench partially extending through a thickness of the second well region, wherein an insulating film is provided to substantially cover the inner surface of the trench and wherein a first gate is formed on the insulating film so as to substantially fill the trench; and in which the device is configured such that during operation of the device a depletion region at a junction between the base region and the first well region extends to a junction between the first well region and the second well region with increasing anode potential until the anode potential reaches a predetermined threshold potential so that the potential of the first well region is isolated from an increase in the potential of the anode contacts above the predetermined threshold.

2. A semiconductor structure comprising a plurality of the semiconductor devices according to claim 1, arranged in substantially parallel rows of the semiconductor devices, and including a plurality of trenches arranged in substantially parallel rows, substantially perpendicular to the rows of semiconductor devices, each trench being configured to longitudinally intersect the second well and drift regions, and laterally intersect the base, first well and second well regions, of one of the semiconductor devices on each row of the semiconductor devices; and wherein an insulating film is provided to substantially cover the inner surface of at least one of the trenches, with a gate being formed on the insulating film so as to substantially fill the trench, characterised in that at least a proportion of the semiconductor devices of the or each substantially parallel row of semiconductor devices are configured to be operative, with remaining inoperative devices being designated as dummy cells.

3. A structure according to claim 2, wherein each of the semiconductor devices of alternate rows of the semiconductor devices are configured to be operative, with the semiconductor devices of the remaining rows being designated as dummy cells.

4. A structure according to claim 3, wherein said connecting portions comprise one or more trenches.

5. A structure according to claim 2, wherein a plurality of the cells and/or semiconductor devices are connected together in clusters by connecting portions.

6. A method of manufacturing the semiconductor device according to claim 1, comprising the steps of forming the second well region within a semiconductor layer of the second conductivity type, such that the remaining semiconductor layer forms the drift region, forming the first well region within the second well region, forming the base region within the first well region, and forming the cathode region; the method further comprising forming the elongate trench such that it longitudinally intersects the second well region and the drift region, and laterally intersects the base region and first well region, the method further comprising the steps of forming a plurality of the semiconductor devices according to claim 1 on a semiconductor substrate characterised in that a portion of the semiconductor devices are configured to be operative with remaining inoperative devices designated as dummy cells.

7. A method according to claim 6, wherein each of said trench is formed prior to formation of each of said cathode region.

8. A method according to claim 6, comprising the steps of forming a plurality of the semiconductor devices according to claim 1 on the semiconductor substrate, the semiconductor devices being arranged in one or more substantially parallel rows, and forming a plurality of elongate trenches in substantially parallel rows which run substantially perpendicular to the row or rows of the semiconductor devices, such that each trench longitudinally intersects the second well region and drift region, and laterally intersects the base region and first well region of at least one of the semiconductor devices.

9. A method according to claim 8, wherein each device of the substantially parallel rows of devices is configured to be operative.

10. A method according to claim 8, wherein each device of alternate rows of the semiconductor devices are configured to be operative, with the semiconductor devices of the remaining rows being designated as dummy cells.

11. A method according to claim 6, wherein each of the trenches laterally intersects the first and second well regions of the respective semiconductor device.

12. A method according to claim 11, wherein each of the trenches does not extend through the full thickness of a second well region.

13. A method according to claim 11, wherein each of the trenches extends laterally through the full thickness of the second well region into the drift region.

14. A method according to claim 6, further comprising the step of forming an insulating layer on the inner surface of each of the trenches, and forming a gate configured to substantially fill the respective trench.

* * * * *